(12) United States Patent
Chien et al.

(10) Patent No.: US 9,036,125 B2
(45) Date of Patent: May 19, 2015

(54) LIQUID CRYSTAL DISPLAY PANEL AND MANUFACTURING METHOD THEREOF

(71) Applicant: INNOLUX CORPORATION, Miao-li County (TW)

(72) Inventors: Charles Chien, Miao-li County (TW); Shang-Yu Huang, Miao-li County (TW); Tsau-Hua Hsieh, Miao-li County (TW); Hung-Sheng Cho, Miao-li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/031,102

(22) Filed: Sep. 19, 2013

(65) Prior Publication Data
US 2014/0017835 A1    Jan. 16, 2014

Related U.S. Application Data

(62) Division of application No. 12/788,303, filed on May 27, 2010, now Pat. No. 8,570,478.

(51) Int. Cl.
*G02F 1/1345* (2006.01)
*H01L 33/08* (2010.01)

(52) U.S. Cl.
CPC ............ *H01L 33/08* (2013.01); *G02F 1/13454* (2013.01); *G02F 2203/28* (2013.01)

(58) Field of Classification Search
USPC ......................................................... 349/149
See application file for complete search history.

(56) References Cited

U.S. PATENT DOCUMENTS

2007/0194317 A1*  8/2007  Lim et al. ........................ 257/72

\* cited by examiner

*Primary Examiner* — Eric Wong
(74) *Attorney, Agent, or Firm* — Li & Cai Intellectual Property (USA) Office

(57) ABSTRACT

A liquid crystal display panel includes a substrate, a thin film transistor array, a circuit, and a dummy circuit. One surface of the substrate is divided into a display region and a wiring region. The thin film transistor array is formed on the display region. The circuit and the dummy circuit are formed on the wiring region, the dummy circuit is adjacent to the circuit, and the circuit and the dummy circuit protrude from the substrate.

10 Claims, 5 Drawing Sheets

LIQUID CRYSTAL DISPLAY PANEL AND MANUFACTURING METHOD THEREOF

BACKGROUND

1. Technical Field

The present disclosure relates to a liquid crystal display panel and a manufacturing method for manufacturing the liquid crystal display panel.

2. Description of Related Art

At present, many liquid crystal display panels or liquid crystal optical assemblies include alignment films. If a substrate is covered by an alignment film, a process of rubbing follows to more orderly arrange and align the liquid crystals, such that a desirable display mode is achieved.

However, force exerted during rubbing is difficult to normalize, possibly causing thickness of the alignment film to be non-uniform. The result is occurrence of mura.

SUMMARY

The present disclosure provides a liquid crystal display and a manufacturing method thereof.

One embodiment of the present disclosure discloses a liquid crystal display panel, which includes a substrate, a thin film transistor array, at least one circuit, and at least one supporting structure. A surface of the substrate is divided into a display region and a wiring region and the wiring region is located at the outside of the display region. The thin film transistor array is formed on the display region. The circuit is formed on the wiring region and adjacent to one edge of the display region, and the circuit is capable of transmitting signals to the thin film transistor array. The supporting structure is formed on the wiring region and adjacent to the circuit and the edge of the display region and the supporting structure is formed in an area without the circuit.

Another embodiment of the present disclosure discloses a manufacturing method for the liquid crystal display panel. First, a substrate with one surface having a display region and a wiring region is provided, and the wiring region is located at the outside of the display region. Then, a thin film transistor array is formed on the display region, and at least one circuit and at least one supporting structure are formed on the wiring region. The circuit and the supporting structure are adjacent to one edge of the display region, the circuit is electrically connected to the thin film transistor array, and the supporting structure is formed in an area without the circuit.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION

Figure 1:
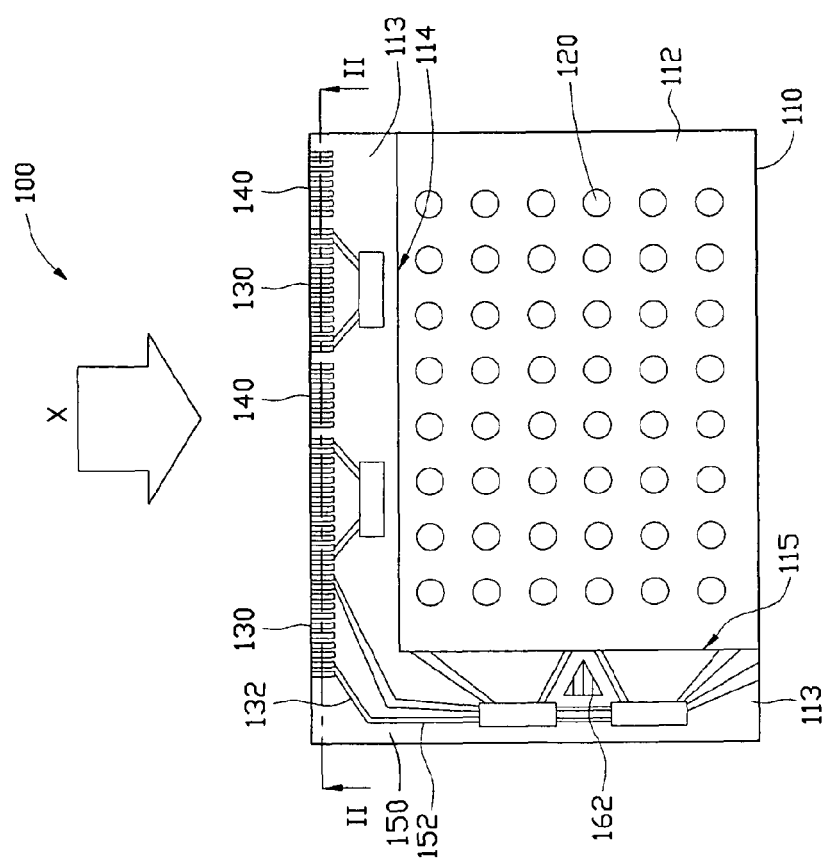
FIG. 1 is a plan view of a first embodiment of a liquid crystal display panel.
Figure 2:
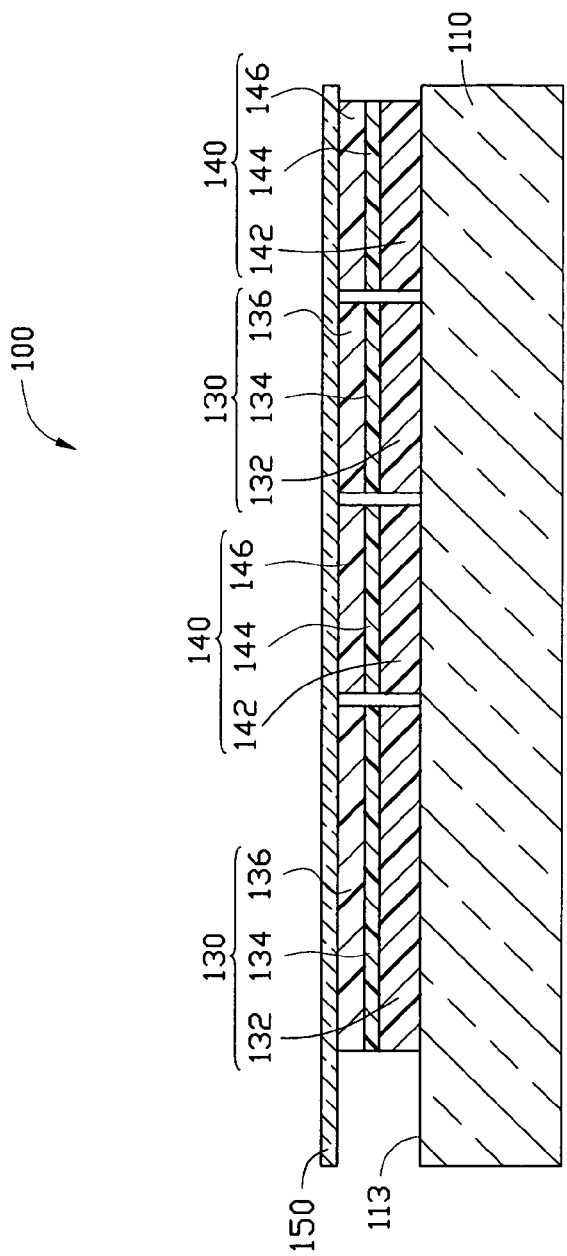
FIG. 2 is a cross-section of the liquid crystal display panel of FIG. 1, taken along line II-II thereof.

Referring to FIGS. 1 and 2, a first embodiment of a liquid crystal display panel 100 includes a substrate 110, a thin film transistor array 120, a plurality of first circuits 130, a plurality of first support structures 140, and an alignment film 150. In the illustrated embodiment, the first support structures 140 are dummy circuits, for example.

A surface of the substrate 110 is divided into a display region 112 and a wiring region 113 located outside of the display region 112. In the illustrated embodiment, the display region 112 is substantially rectangular, and the wiring region 113 encompasses two adjacent sides of the display region 112. The display region 112 has a first edge 114 and a second edge 115 intersecting with the first edge 114. In the illustrated embodiment, the substrate 110 is made of glass, and the first edge 114 is substantially perpendicular to the second edge 115.

The thin film transistor array 120 is formed on the display region 112 of the substrate 110.

The first circuits 130 and the first support structures 140 are formed on the wiring region 113 and adjacent to the first edge 114 of the display region 112. The first support structures 140 are also formed adjacent to the first circuits 130. The first support structures 140 and the first circuits 130 protrude from the substrate 110 correspondingly, and the first support structures 140 are formed in an area without the first circuits 130. As an example, the first circuits 130 and the first support structures 140 can be arrayed in a line, with the first support structures 140 arrayed to fill gaps between the first circuits 130. In the illustrated embodiment, the first circuits 130 and the first support structures 140 are arrayed in a line substantially parallel to the first edge 114 of the display region 112. Only one first circuit 130 and only one first support structure 140 may be provided, although any number of first circuits 130 and the first support structures 140 may be employed.

Each first circuit 130 protruding from the substrate 110 includes a first pattern 132, a first insulation layer 134, and a first conduction layer 136. The first pattern 132 is formed on the wiring region 113 of the first substrate 110. The first insulation layer 134 is formed on the first pattern 132. The first conductive layer 136 is formed on the first insulation layer 134. The first conduction layer 136 is transparent and made of indium tin oxide (ITO).

Each first support structure 140 protruding from the substrate 110 includes a first dummy pattern 142, a first dummy insulation layer 144, and a first dummy conduction layer 146. The first dummy pattern 142 is formed on the wiring region 113 of the first substrate 110 as the first pattern 132. The first dummy insulation layer 144 is formed on the first dummy pattern 142. The first dummy conduction layer 146 is formed on the first insulation layer 144. In one embodiment, the first dummy conduction layer 146 is transparent and made of ITO. A thickness of each first support structure 140 protruding from the substrate 110 is substantially equal to a thickness of each first circuit 130 protruding from the substrate 110, such that the height difference of the surface of the wiring region 113 adjacent to the first edge 114 of the display region 112 can be minimized. A rubbing process can easily direct the alignment film 150 because of the first insulation layer 134, the first conduction layer 136, the first dummy insulation layer 144, and the first dummy conduction layer 146.

The first dummy patterns 142 formed between the first patterns 132 are capable of reducing the height difference of the terrain on the substrate 110. In one embodiment, the thickness of each first dummy pattern 142 is substantially equal to the thickness of each first pattern 132.

The alignment film 150 exhibits excellent qualities of transparence, conduction, and heat-resistance. In the illustrated embodiment, the alignment film 150 is made of polyimide.

During fabrication of the liquid crystal display panel 100, the alignment film 150 is covered over the substrate 110 on which the first circuits 130 and the first support structures 140 are positioned, and rubbed in a first direction X. Since the first support structures 140 are filled in gaps between the first circuits 130, force of rubbing the alignment film in the first direction X remains uniform, in addition, mura is avoided.

When there is no mura, the thicknesses of the first support structures 140 protruding from the substrate 110 can be a little larger or smaller than the thicknesses of the first circuits 130 within a flexible range.

The liquid crystal display panel 100 further includes a plurality of other circuits 152 and other support structures 162 on a portion of the wiring region 113 adjacent to the second edge 115. The circuits 152 are connected with and similar to the first circuit 130, and the support structures 162 are similar to the first support structure 140. A thickness of each circuit 152 can be substantially equal to a thickness of each support structure 162, such that the height difference of the terrain on the wiring region 113 adjacent to the of the display region 112 can be reduced. The height difference of the surface of the wiring region 113 adjacent to the second edge 115 of the display region 112 can be minimized.

In use, if a liquid crystal display panel of a small size requires circuits formed adjacent to one side only, the support structures are formed adjacent to this one side correspondingly. If a large liquid crystal display panel requires circuits formed adjacent to two or more sides, the support structures are correspondingly formed adjacent to these sides.

In this embodiment, each first circuit 130 has an electrical connection with the thin film transistor array 120 in the display region 112, and each first support structure 140 has no electrical connection with the thin film transistor array 120. The first circuits 130 are capable of transmitting electrical signals from peripheral circuits (not shown) to the thin film transistor array 120, such that the thin film transistor array 120 may be controlled by the peripheral circuits.

In this embodiment, the second patterns 150 and the second dummy patterns 160 may be omitted, as may the first support structures 140 and the second dummy patterns 160 which can be replaced by other support structures, such as blocks, protrusions, or other structures formed on the substrate 110.

Figure 3:
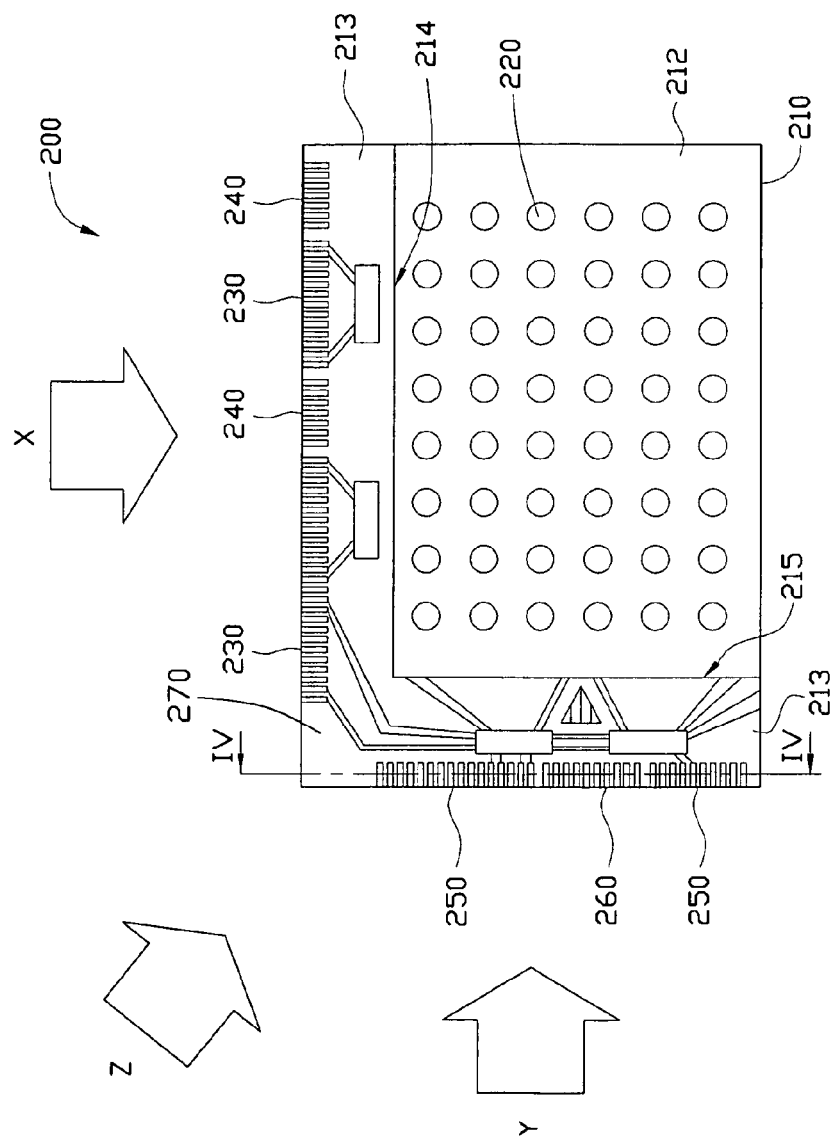
FIG. 3 is a plan view of a second embodiment of a liquid crystal display panel.
Figure 4:
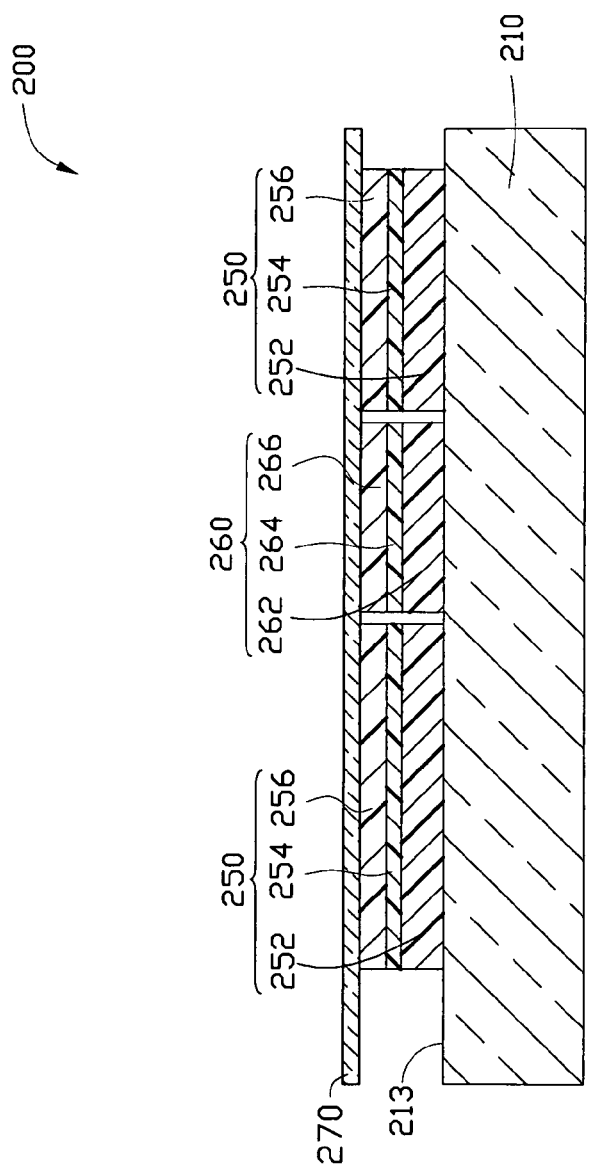
FIG. 4 is a cross-section of the liquid crystal display panel of FIG. 3, taken along line IV-IV thereof.

Referring to FIGS. 3 and 4, a second embodiment of a liquid crystal display panel 200 includes a substrate 210 differing from the substrate 110 of FIG. 1, in that the surface thereof is divided into a display region 212 and a wiring region 213. The display region 212 has a first edge 214 and a second edge 215 intersecting the first edge 214. In the illustrated embodiment, the first edge 214 is substantially perpendicular to the second edge 215.

The thin film transistor array 220 is formed on the display region 212.

The first circuits 230 and the first support structures 240 have the same structure as the first circuits 130 (referring to FIG. 1) and the first support structures 140, each first circuit 230 including a first pattern, and each first support structure 240 including a first dummy pattern (not shown).

The second circuits 250 and the second support structures 260 are disposed on a portion of the wiring region 213 adjacent to the second edge 215 and protrude from the substrate 210 correspondingly. Each second circuit 250 includes a second pattern 252, a second insulation layer 254, and a second conduction layer 256. The second pattern 252 is formed on the substrate 210, the second insulation layer 254 is formed on the second pattern 252, and the second conduction layer 256 is formed on the second insulation layer 254. The second conduction layer 256 can be transparent and made of ITO.

Each second support structure 260 includes a second dummy pattern 262, a second dummy insulation layer 264, and a second dummy conduction layer 266. The second dummy pattern 262 is formed on the substrate 210, the second dummy insulation layer 264 is formed on the second dummy pattern 262, and the second dummy conduction layer 266 is formed on the second dummy insulation layer 264. The second dummy conduction layer 266 is transparent and made of ITO. A thickness of each second support structure 260 protruding from the substrate 210 corresponds to each second circuit 250 protruding from the substrate 210. In the illustrated embodiment, the thickness of each second support structure 260 is substantially equal to a thickness of each second circuit 250.

In the liquid crystal display panel 200, the second pattern 252 of each second circuit 250 is electrically connected with the thin film transistor array 220 on the display region 212, and each second support structure 260 is not electrically connected with the thin film transistor array 220. The second circuits 250 are capable of transmitting electrical signals from peripheral circuits to the thin film transistor array 220, such that the thin film transistor array 220 may be controlled by the peripheral circuits through the second circuits 250.

The height difference of the terrain on the wiring region 213 adjacent to both the first edge 214 and the second edge 215 is reduced, such that a force of rubbing in the first direction X or a second direction Y, while applying the alignment film 270 over the substrate 210, remains uniform, whereby no mura is generated. In addition, the thicknesses of each second circuit 250 and each second support structure 260 are substantially equal to the thicknesses of each first circuit 230 and each first support structure 240, such that force of rubbing in a third direction Z, while applying the alignment film 210, remains uniform.

The alignment film 270 exhibits superior transparence, conduction, and heat-resistance. In the illustrated embodiment, the alignment film 270 is made of polyimide.

During fabrication of the liquid crystal display panel 200, the alignment film 270 is disposed on the substrate 210 on which the second circuits 250 and the second support structures 260 are positioned, and rubbed in the second direction Y. Since the second support structures 260 fill in gaps between the second circuits 250, the difference height of the terrain on the wiring region 213 adjacent to the second edge 215 of the display region 210 is reduced, in addition, the rubbing force remains stable and mura is avoided.

In the absence of mura, the thicknesses of the second support structures 260 protruding from the substrate 210 can deviate from those of the second circuits 250 in a flexible range.

Furthermore, the thicknesses of the first and second support structures 240, 260 are substantially equal to the thicknesses of the first and second circuits 230, 250, allowing the alignment film 270 to be rubbed in a third direction Z. Moreover, the rubbing force remains uniform and mura is reduced.

As described, the liquid crystal display panel 200 may include a substrate 210, a thin film transistor array 220, circuits, and support structures. The circuits may include the first circuits 230 and/or the second circuits 250, but are not limited in this respect. For instant, the circuits may be formed around the thin film transistor array 220 when enough space around the thin film transistor array 220 is provided.

The number of the first circuits 230, the first support structures 240, the second circuits 250, and the second support structures 260 may be any number according to the size of the substrate 210. The first support structures 240 and the second support structures 260 may be replaced by other support structures, such as blocks, protrusions, or other structures formed on the substrate 210.

Figure 5:
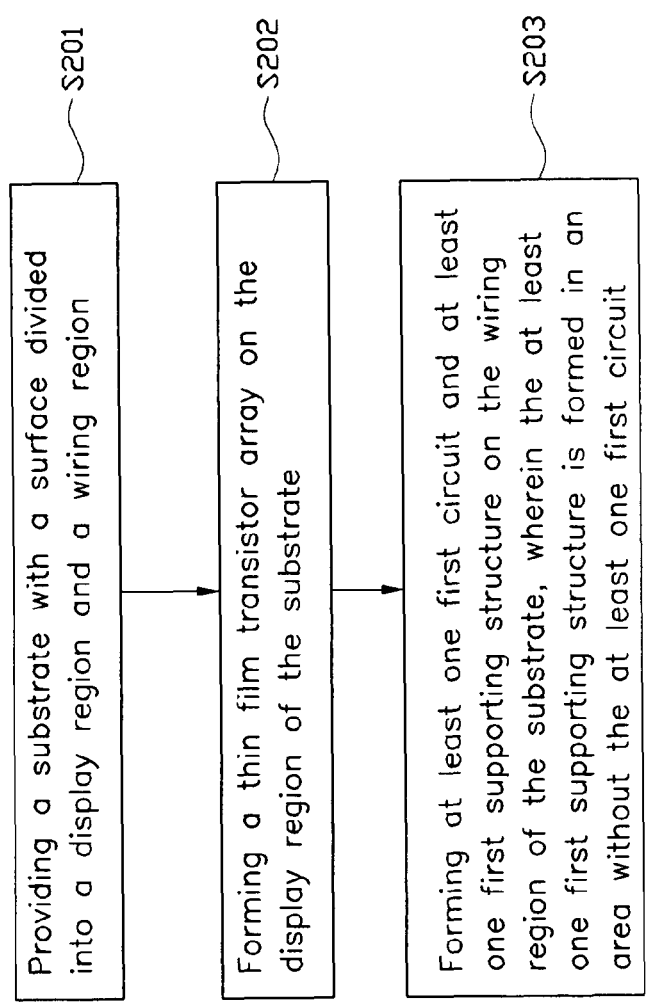
FIG. 5 is a flowchart of a manufacturing method for a liquid crystal display panel.

FIG. 5 shows a manufacturing method of the liquid crystal display panel 200. The manufacturing method includes the following steps S201, S202, S203, and S204. The steps are not limited in the illustrated order, the adjustment of the order is allowed, and some steps may be performed simultaneously or partially simultaneously.

In step S201, a substrate 210 with a surface divided into the display region 212 and the wiring region 213 is provided. The wiring region 213 is located outside of the display region 212.

In step S202, the thin film transistor array 220 is formed on the display region 212 of the substrate 210.

In step S203, the first and second circuits 230, 250 and the first and second support structures 240, 260 are formed on the wiring region 213 of the substrate 210, and the wiring region 213 is formed adjacent to at least one edge of the display region 212.

The first and second support structures 240, 260 are formed in an area without the first and second circuits 230, 250 adjacent to the at least one edge. The thicknesses of each first and each second circuit 230, 240 are formed substantially equal to the thicknesses of each first and each second dummy circuit 250, 260. In the illustrated embodiment, the first and second circuits 230, 240 and the first and second dummy circuits 250, 260 are formed in an area adjacent to two edges 214, 215 of the display region 212.

Referring to FIGS. 3 through 5, the manufacturing method can be described as follows.

During manufacture of the liquid display panel 200, the substrate 210 with a surface divided into the display region 212 and the wiring region 213 is provided, and the wiring region 213 is located outside of the display region 212. The thin film transistor array 220 is arrayed on the display region 212 of the substrate 210. The first circuits 230 and the first support structures 240 are formed on the wiring region 213, and the first circuits 230 are formed adjacent to the first edge 214 of the display region 212 and electrically connected to the thin film transistor array 220. The first support structures 240 are formed in an area without the first circuit 230 but adjacent to the first circuits 230.

While forming the first circuits 230 and the first support structures 240 on the wiring region 213 of the substrate 210, the first support structures 240 are formed to protrude from the substrate 220 corresponding to the first circuits 230, and the first support structures 240 are formed adjacent to the first circuits 230. In one embodiment, the thicknesses of the first support structures 240 are substantially equal to the thicknesses of the first circuits 230.

During formation of the first circuits 230 and the first support structures 240 on the wiring region 213 of the substrate 210, the first circuits 230 and the first support structures 240 are formed to have the same structure as the first circuits 130 (referring to FIGS. 1 and 2) and the first support structures 140. The first patterns and the first dummy patterns are formed on the substrate 210. The first insulation layers are formed on the first patterns, and the first dummy insulation layers are formed on the first dummy patterns. The first conduction layers are formed on the first insulation layers, and the first dummy conduction layers are formed on the first dummy insulation layers. The first conduction layer and the first dummy conduction layer can be made of ITO.

The second circuits 250 and the second support structures 260 are also formed on the wiring region 213 of the substrate 210 during manufacture of the liquid crystal display panel 200. The second circuits 250 and the second support structures 260 are formed adjacent to the second edge 215 of the display region 212. The first edge 214 and the second edge 215 are next to each other, and the second support structures 260 are formed in an area with no second circuits 250.

During formation of the second circuits 250 and the second support structures 260 on the wiring region 213 of the substrate 210, the second circuits 250 and the second support structures 260 are formed to protrude from the substrate 220 correspondingly, and the second support structures 260 are formed adjacent to the second circuits 250.

During formation of the second circuits 250 and the second support structures 260 on the wiring region 213 of the substrate 210, the second patterns 252 and the second dummy patterns 262 are first formed on the substrate 210. In the illustrated embodiment, the second patterns 252 connect with the first patterns. In addition, the second insulation layers 254 are formed on the second patterns 252, and the second dummy insulation layers 264 are formed on the second dummy patterns 262. The second conduction layers 256 are formed on the second insulation layers 254, and the second dummy conduction layers 266 are formed on the second dummy insulation layers 264. The second conduction layers 256 and the second dummy conduction layers 266 can be made of ITO.

During formation of the second circuits 250 and the second support structures 260 on the substrate 210, the thicknesses of the second support structures 260 are formed substantially equal to the thicknesses of the second circuits 250. Furthermore, the thicknesses of the second circuits 250 are formed substantially equal to the thicknesses of the first circuits 230, and the thicknesses of the second support structures 260 are formed substantially equal to the thicknesses of the first support structures 240.

Furthermore, the alignment film 270 is formed on the first circuits 230 and the first support structures 240, the alignment film 270 is also formed on the second circuits 240 and the second support structures 250.

It is believed that the present embodiments and their advantages will be understood from the foregoing description, and it will be apparent that various changes may be made thereto without departing from the spirit and scope of the embodiments or sacrificing all of their material advantages.

What is claimed is:

1. A manufacturing method for a liquid crystal display panel, comprising:
   providing a substrate comprising a surface having a display region and a wiring region located outside of the display region;
   forming a thin film transistor array on the display region; and
   forming a plurality of first circuits and a plurality of first support structures on the wiring region, wherein the first circuits and the first support structures are adjacent to a first edge of the display region, the first circuits transmit signals to the thin film transistor array, the first support structures are formed in an area without the first circuits, the first circuits are arranged alternatively with the first support structures, and at least one of the first support structures is a first dummy circuit.

2. The manufacturing method for the liquid crystal display panel of claim 1, wherein the formation of the first circuits and the first support structures on the wiring region comprises controlling a thickness of the first circuits protruding from the substrate to be substantially equal to a thickness of the first support structures.

3. The manufacturing method for the liquid crystal display panel of claim 2, wherein the formation of the first circuits and the first support structures on the wiring region further comprises forming a first pattern and a first dummy pattern on the substrate, forming a first insulation layer on the first pattern and a first dummy insulation layer on the first dummy pattern, and forming a first conduction layer on the first insulation layer and a first dummy conduction layer on the first dummy insulation layer in order.

4. The manufacturing method for the liquid crystal display panel of claim 3, further comprising forming at least one second circuit and at least one second support structure on the wiring region, wherein the at least one second circuit and the at least one second support structure are adjacent to a second edge of the display region, the first edge of the display region is next to the second edge of the display region, and the at least one second support structure is formed in another area without the at least one second circuit.

5. The manufacturing method for the liquid crystal display panel of claim 4, wherein formation of the at least one second circuit and the at least one second support structure on the wiring region comprises controlling a thickness of the at least one second circuit protruding from the substrate to be substantially equal to a thickness of the at least one second support structure.

6. The manufacturing method for the liquid crystal display panel of claim 5, wherein formation of at least one second circuit and at least one second support structure on the wiring region further comprises controlling the thickness of the first circuits protruding from the substrate to be substantially equal to the thickness of the at least one second circuit and the thickness of the first support structures protruding from the substrate to be substantially equal to the thickness of the at least one second support structure.

7. The manufacturing method for the liquid crystal display panel of claim 4, wherein formation of at least one second circuit and at least one second support structure on the wiring region comprises forming a second pattern and a second dummy pattern on the substrate while forming the first pattern and the first dummy pattern, forming a second insulation layer on the second pattern and a second dummy insulation layer on the second dummy pattern while forming the first insulation layer and the first dummy insulation layer, and forming a second conduction layer on the second insulation layer and a second dummy conduction layer on the second dummy insulation layer in order, wherein the second pattern is connected to the first pattern.

8. The manufacturing method for the liquid crystal display panel of claim 1, further comprising forming an alignment film on the first circuits and the first support structures.

9. The manufacturing method for the liquid crystal display panel of claim 1, wherein the first circuits and the first support structures are arranged in a line.

10. The manufacturing method for the liquid crystal display panel of claim 1, wherein at least one of the first support structures has no electrical connection with the thin film transistor array.

* * * * *